United States Patent
Kawachi et al.

(10) Patent No.: US 6,830,775 B1
(45) Date of Patent: Dec. 14, 2004

(54) METHOD OF MANUFACTURING SUPERCONDUCTING QUANTUM INTERFERENCE TYPE MAGNETIC FLUXMETER

(75) Inventors: Masaharu Kawachi, Sanda (JP); Masahito Yoshizawa, Morioka (JP); Nobuyoshi Sato, Hitachi (JP)

(73) Assignee: Japan Science and Technology Agency, Kawaguchi (JP)

( * ) Notice: Subject to any disclaimer, the term of this patent is extended or adjusted under 35 U.S.C. 154(b) by 0 days.

(21) Appl. No.: 10/702,617

(22) Filed: Nov. 7, 2003

Related U.S. Application Data

(63) Continuation of application No. PCT/JP02/01278, filed on Feb. 15, 2002.

(30) Foreign Application Priority Data

May 7, 2001 (JP) ........................................ 2001-136454

(51) Int. Cl.[7] .............................. B05D 5/12; H01L 39/24; C25D 15/00
(52) U.S. Cl. .................... 427/62; 427/237; 427/181; 427/189; 427/197; 427/202; 427/372.2; 427/419.1; 505/434; 505/472; 204/471; 204/479; 204/487
(58) Field of Search ........................ 427/62, 181, 189, 427/197, 202, 372.2, 419.1; 29/599; 505/434, 472; 204/471, 479, 487

(56) References Cited

U.S. PATENT DOCUMENTS

| | | | | | |
|---|---|---|---|---|---|
| 5,162,298 | A | * | 11/1992 | Chaudhari et al. | 505/162 |
| 5,666,052 | A | * | 9/1997 | Sata | 324/248 |
| 5,767,043 | A | * | 6/1998 | Cantor et al. | 505/162 |
| 5,854,492 | A | * | 12/1998 | Chinone et al. | 257/31 |
| 5,986,280 | A | * | 11/1999 | Kugai | 257/34 |
| 6,285,186 | B1 | * | 9/2001 | Morooka | 324/248 |
| 6,384,424 | B1 | * | 5/2002 | Kugai et al. | 257/31 |

FOREIGN PATENT DOCUMENTS

| | | |
|---|---|---|
| JP | Hei 3-78674 | 4/1991 |
| JP | Hei 4-37075 | 2/1992 |
| JP | Hei 5-281316 | 10/1993 |
| JP | Hei 5-345612 | 12/1993 |

* cited by examiner

Primary Examiner—Brian K. Talbot
(74) Attorney, Agent, or Firm—Oblon, Spivak, McClelland, Maier & Neustadt, P.C.

(57) ABSTRACT

The method of manufacturing a superconducting quantum interference type magnetic fluxmeter including forming an input coil and a pickup coil integrated with the input coil by electrophoretically depositing high-temperature superconducting fine particles on a surface of the first cylindrical ceramic substrate, and sintering the fine particles, forming a high-temperature superconductor magnetic shield tube by electrophoretically depositing high-temperature superconducting fine particles on an entire surface of the second cylindrical ceramic substrate, and sintering the fine particles, magnetically coupling the input coil and the high-temperature superconducting quantum interference type element by placing the pickup coil such that a distal end portion thereof is inserted within a lower end portion of the magnetic shield tube and inserting the high-temperature superconducting quantum interference type element from an upper end portion of the magnetic shield tube.

16 Claims, 3 Drawing Sheets

METHOD OF MANUFACTURING SUPERCONDUCTING QUANTUM INTERFERENCE TYPE MAGNETIC FLUXMETER

CROSS-REFERENCE TO RELATED APPLICATIONS

This is a Continuation Application of PCT Application No. PCT/JP02/01278, filed Feb. 15, 2002, which was not published under PCT Article 21(2) in English.

This application is based upon and claims the benefit of priority from the prior Japanese Patent Application No. 2001-136454, filed May 7, 2001, the entire contents of which are incorporated herein by reference.

BACKGROUND OF THE INVENTION

1. Field of the Invention

The present invention relates to a method of manufacturing a superconducting quantum interference magnetic type fluxmeter, more specifically, a superconducting quantum interference magnetic type fluxmeter that employs a high-temperature superconductor thin film.

2. Description of the Related Art

The superconducting quantum interference device (to be called "SQUID" hereinafter) type magnetic fluxmeter is a magnetic sensor having such a high sensitivity that a magnetic field of 1/5,000 or less of the terrestrial magnetism can be detected. The sensor utilizes the quantization phenomenon of the superconductor, and has a sensitivity higher by 3 figures or more than that of the conventional magnetic sensor. In particular, after the development of the SQUID magnetic fluxmeter using a high-temperature superconductor thin film, it has become possible to operate the sensor at a temperature of liquid nitrogen (77.3K), and therefore the field of the application is becoming wider.

The SQUID magnetic fluxmeter is a device in which junctions formed by finely processing superconducting thin film are connected to each other in parallel as shown in FIG. 1. When a bias current is allowed to flow to the SQUID magnetic fluxmeter, the voltage generated at both ends of the SQUID magnetic fluxmeter is zero since the superconducting state is maintained until the bias current becomes the critical value (Ic) as shown in FIG. 2. When the current exceeds the critical value, the SQUID magnetic fluxmeter changes its state to the normal conducting state, and thus a voltage is generated.

On the other hand, when a magnetic field is applied to the SQUID magnetic fluxmeter and a magnetic flux is put into a loop formed by the junctions connected to each other in parallel, the critical current value is lowered.

Incidentally, as shown in FIG. 3, if the bias current is fixed to the value close to the critical current and a magnetic field is applied from outside, the voltage generated at both ends of the SQUID magnetic fluxmeter changes. The strength of the magnetic field can be measured by detecting the change in the voltage.

However, such a SQUID magnetic fluxmeter that employs a conventional high-temperature superconductor thin film entails a drawback in which the manufacture of its pick-up coil is very difficult. More specifically, it is difficult to mold and process the high-temperature superconducting material, and it is not possible to finish it into the shape of a co-axial pickup coil. Therefore, a flat planar-type pickup coil is conventionally manufactured in the form of an integral body with a SQUID element, which is a thin film device.

In short, the co-axial type pickup coil made from a high-temperature superconducting material has never been manufactured.

As described above, the pickup coil of a conventional SQUID magnetic fluxmeter that employs a high-temperature superconducting material is of a planar type, which is, in actual measurement of magnetism, not sensitive for the magnetic gradient in a vertical direction to the SQUID element itself.

The present invention has been achieved under the above-described circumstances, and the object of the invention is to provide a method of manufacturing a superconducting quantum interference type magnetic fluxmeter equipped with a coaxial type pickup coil that has a high sensitivity to the magnetic gradient in a vertical direction to the SQUID element.

BRIEF SUMMARY OF THE INVENTION

In order to solve the above-described drawbacks of the prior art, there is provided, according to the present invention, a method of manufacturing a superconducting quantum interference type magnetic fluxmeter characterized by comprising: forming a conductive pattern on an outer surface of a first cylindrical ceramic substrate; electrophoretically depositing high-temperature superconducting fine particles and/or high-temperature superconducting precursor fine particles on the conductive pattern; and subjecting the first cylindrical ceramic substrate to a heat treatment to sinter the fine particles, thereby forming an input coil and a pickup coil integrated with the input coil.

It is possible that the method of manufacturing a superconducting quantum interference type magnetic fluxmeter, according to the present invention, characterized by further comprising: forming a conductive layer on an inner surface of an upper section of the first cylindrical ceramic substrate, electrophoretically depositing high-temperature superconducting fine particles and/or high-temperature superconducting precursor fine particles on the conductive layer, and subjecting the first cylindrical ceramic substrate to a heat treatment to sinter the fine particles, thereby forming a first magnetic shield layer on the inner surface of the upper section of the first cylindrical ceramic substrate.

It is further possible that the method of manufacturing a superconducting quantum interference type magnetic fluxmeter, according to the present invention, characterized by further comprising: placing the pickup coil such that a distal end portion thereof is inserted within a lower end portion of a magnetic shield tube having a second high-temperature superconductor shield layer on an outer surface thereof; and inserting a high-temperature superconducting quantum interference type element from an upper end portion of the magnetic shield tube, thereby magnetically coupling the input coil and the high-temperature superconducting quantum interference type element.

In this case, the magnetic shield tube can be obtained by forming a conductive layer on an outer surface of a second cylindrical ceramic substrate having an inner diameter larger than an outer diameter of the pickup coil, electrophoretically depositing high-temperature superconducting fine particles and/or high-temperature superconducting precursor fine particles on the conductive layer, and subjecting the second cylindrical ceramic substrate to a heat treatment to sinter the fine particles, thereby forming a second high-temperature superconducting shield layer.

In the above-described methods of the present invention, the conductive pattern, conductive layer and conductive film can be obtained by forming a conductive paste layer on a surface of a ceramic substrate and subjecting the conductive paste layer to a heat treatment. Alternatively, they can be formed by plating a conductive material or vapor deposition of a conductive material.

It should be noted that the conductive pattern, conductive layer and conductive film should be of a type that contains silver as its main component.

As described above, with the method of manufacturing a superconducting quantum interference type magnetic fluxmeter according to the present invention, it is possible to form a coaxial type pickup coil on an outer surface of a cylindrical ceramic substrate so as to be integrated with an input coil, and therefore a high sensitivity can be achieved for a magnetic gradient in a vertical direction to the high-temperature superconducting quantum interference type element. Further, the scale of the pickup coil can be easily increased, and therefore the sensitivity can be easily improved.

DETAILED DESCRIPTION OF THE INVENTION

Figure 1:
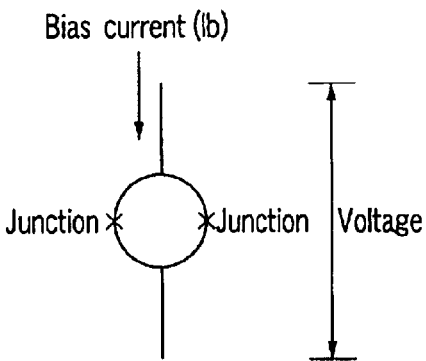
FIG. 1 is an explanatory diagram illustrating the operation principle of a SQUID magnetic fluxmeter.
Figure 2:
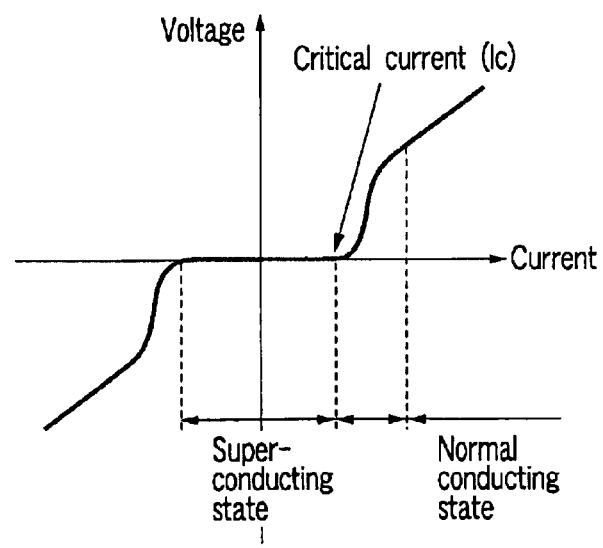
FIG. 2 is an explanatory diagram illustrating the operation principle of a SQUID magnetic fluxmeter.

Embodiments of the present invention will now be described.

The present invention is characterized in that an input coil and a coaxial pickup coil integrated with the input coil are formed by depositing high-temperature superconducting fine particles and/or high-temperature superconducting precursor substance fine particles on a cylindrical ceramic substrate by an electrophoretic deposition technique.

The cylindrical ceramic substrate that can be used in the present invention may meet conditions that it has a heat proof up to about 1000° C., it is stable to superconductors and it has a thermal expansion coefficient relatively close to those of superconductors, and the like. The substrate that satisfy these conditions include alumina ($Al_2O_3$), magnesium oxide (MgO) and yttrium-stabilized zirconia (YSZ). Of these examples, alumina is preferable because of its availability.

The high-temperature superconducting fine particles and/or high-temperature superconducting precursor substance fine particles that can be used in the present invention are not particularly limited; however preferable examples thereof are $YBa_2Cu_3O_7$ particles and $YBa_2Cu_4O_8$ particles.

In the present invention, the high-temperature superconducting fine particles and/or high-temperature superconducting precursor substance fine particles are deposited by the electrophoretic deposition technique, and therefore the base material must be conductive. Therefore, the surface of the cylindrical ceramic substrate must be coated with a conductive material. A preferable example of the conductive material is silver, which is a metal that does not react with a superconductor.

As the method of coating the surface of the cylindrical ceramic substrate with a conductive material, a technique of applying a conductive paste on the surface and then subjecting it to a heat treatment, or a technique of applying a conductive material by plating or deposition can be employed.

Usable examples of the silver paste are 904T, FSP-306T and MH-106D (tradenames: Tanaka Kikinzoku Kogyo).

The electrophoretic deposition technique is carried out in the following manner. That is, a cylindrical ceramic substrate is placed in a solvent in which the high-temperature superconducting fine particles and/or high-temperature superconducting precursor substance fine particles are dispersed. Then, an anode is arranged to oppose to a coating conducting material, and a conductive material is used as a cathode. Thus, a voltage is applied between these electrodes. As the solvent, toluene, acetone or the like can be used. The concentration of the fine particles in the solvent is usually 30 mg to 40 mg/cm$^3$, and the concentration of iodine in the solvent is 0.4 mg/cm$^3$.

The conditions for the electrophoretic deposition technique are ordinary ones employed in usual cases. For example, the voltage is 40 to 500V, and the time is 10 to 60 seconds. Note that the electrophoretic deposition technique may preferably be carried out in a state in which the magnetic field is applied in parallel to the electrophoresis direction.

The high-temperature superconducting fine particles and/or high-temperature superconducting precursor substance fine particles thus deposited through electrophoresis are then subjected to a heat treatment, and thus sintered. With the heat treatment, the high-temperature superconducting precursor substance fine particles become high-temperature superconducting fine particles. Here, it is preferable that the temperature of the heat treatment may be 950 to 930° C., and the heat treatment atmosphere may be oxygen.

The above description is directed to a step of forming an input coil and a coaxial type pickup coil made as an integral body with the input coil. It is further possible with the present invention to carry out a step of forming a magnetic shield made of a high-temperature superconducting film on an inner surface of a cylindrical ceramic substrate and a step of preparing a magnetic shield tube by forming a high-temperature superconducting film on an outer surface of another cylindrical ceramic substrate having an inner diameter larger than that of the pickup coil, by a similar process to the above.

A method of manufacturing a superconducting quantum interference magnetic fluxmeter according to an embodiment of the present invention will now be described with reference to accompanying drawings.

Figure 4:
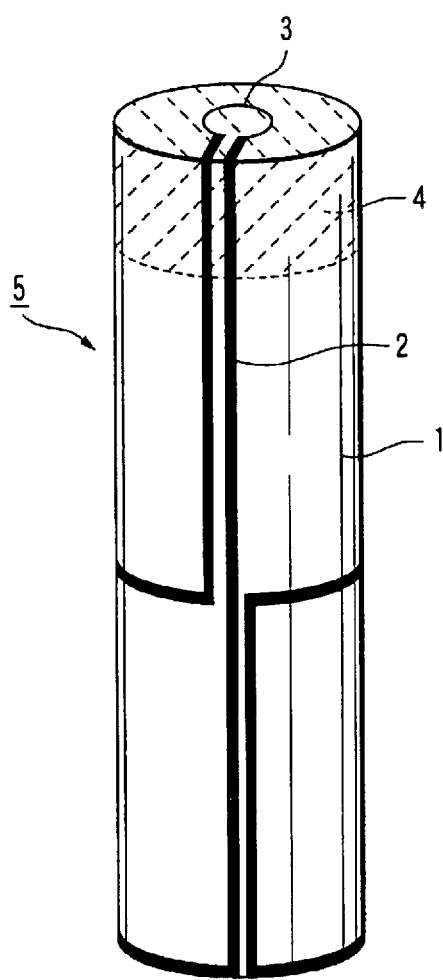
FIG. 4 is a perspective view of a pickup coil taken out from a superconducting quantum interference magnetic fluxmeter manufactured by the method according to an embodiment of the present invention.
Figure 5:
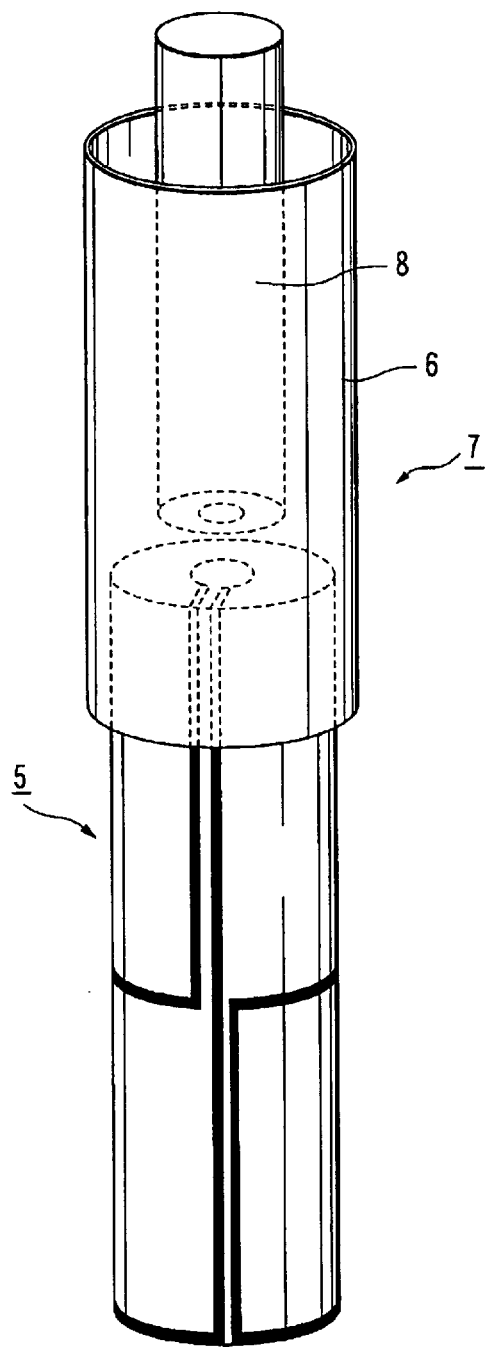
FIG. 5 is a perspective view of a superconducting quantum interference magnetic fluxmeter that comprises a pickup coil.

FIG. 4 is a perspective view of a pickup coil taken out from a superconducting quantum interference magnetic fluxmeter manufactured by the method according to an embodiment of the present invention. FIG. 5 is a perspective view of a superconducting quantum interference magnetic fluxmeter that is equipped with the pickup coil portion shown in FIG. 4.

First, a first cylindrical ceramic substrate 1 made of alumina whose purity is 97% or higher and having an inner diameter of 18 mm and an outer diameter of 21 mm was prepared. On an inner surface of an upper section of the cylindrical ceramic substrate 1, a silver paste film was formed to have a thickness of 0.05 mm by means of screen print. Further, on an outer surface of the upper section of the substrate 1, a silver paste pattern was formed to have the same thickness by the same technique. As the silver paste, FSP-306T (a product of Tanaka Kikinzoku Kogyo) was used.

Next, the first cylindrical ceramic substrate 1 was subjected to a heat treatment at a temperature of 600® C. for one hour in an atmosphere. With the heat treatment, the volatile components of the silver paste was evaporated, and thus the silver component was fixedly attached to the inner surface and outer surface of the first cylindrical ceramic substrate 1. In this manner, an inner surface silver film and outer surface silver pattern both having a thickness of 0.05 mm were formed.

Next, on the inner surface silver film and outer surface silver pattern, high-temperature superconducting fine particles were deposited by electrophoresis. In this embodiment, $YBa_2Cu_3O_7$ particles having a particle diameter of 3 $\mu$m or less were used as the high-temperature superconducting fine particles. The electrophoretic deposition was carried out in the following manner.

That is, the cylindrical ceramic substrate 1 was placed in an electrophoretic deposition bath containing 500 ml of acetone, 200 ml of iodine and 15 g of $YBa_2Cu_3O_7$. A spiral-shaped platinum wire (having a diameter of 0.5 mm) was placed as an anode on an outer side of the cylindrical ceramic substrate 1 and a linear platinum wire (having a diameter of 0.5 mm) was placed in an inner side of the substrate. Note that as the cathode, the inner surface silver-film and outer surface silver pattern formed on the inner and outer surface of the cylindrical ceramic substrate 1 were used.

Then, a voltage of 500V was applied between the anode and cathode for 20 seconds so as to electrophoretically deposit the high-temperature superconducting fine particles on the inner surface silver film and outer surface silver pattern formed on the inner and outer surface of the cylindrical ceramic substrate 1.

Figure 3:
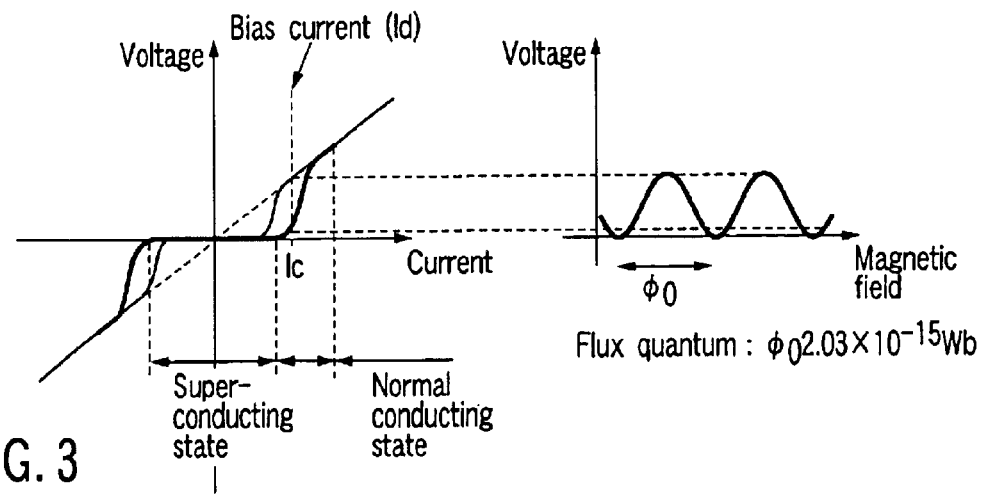
FIG. 3 is an explanatory diagram illustrating the operation principle of a SQUID magnetic fluxmeter.

After that, the first cylindrical ceramic substrate 1 was subjected to a heat treatment of a thermal hysteresis as shown in FIG. 3, and thus the first high-temperature superconducting fine particles were sintered. The atmosphere for the heat treatment was oxygen.

Figure 6:
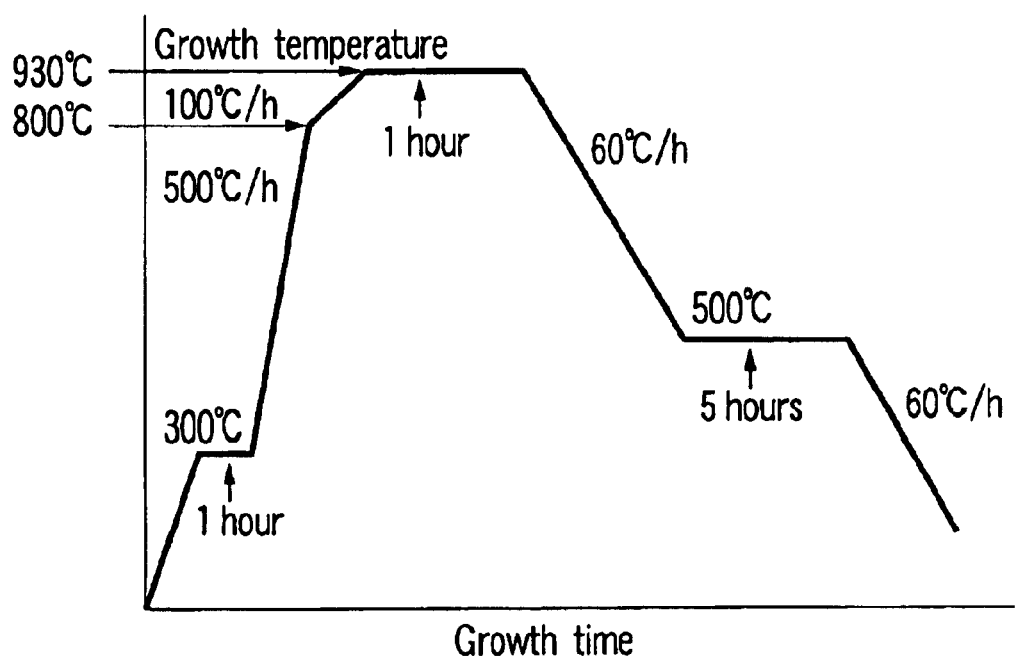
FIG. 6 is a diagram illustrating a thermal hysteresis in a thermal process of high-temperature superconducting fine particles attached by the electrophoretic deposition technique.

The thermal hysteresis was as illustrated in FIG. 6. That is, first, the temperature was raised to 300° C. and maintained there for one hour, and then it was further raised to 800° C. at a temperature increasing rate of 500° C./h. After that, the temperature was further raised up to 930° C. at a temperature increasing rate of 100° C./h, and maintained there for one hour. Next, when lowering the temperature, it was decreased first to 500° C. at a temperature decreasing rate of 60° C./h, and maintained there for 5 hours. Then, it was decreased to room temperature at a temperature decreasing rate of 60° C./h.

As a result, a pickup coil 2 and an input coil 3 were formed on the outer surface of the first cylindrical ceramic substrate 1. At the same time, a first magnetic shield 4 was formed on the inner surface. In this manner, a coaxial-type pickup coil portion 5 comprising the pickup coil 2 and the input coil 3 integrated therewith was obtained.

Next, as illustrated in FIG. 5, a silver paste was applied on an entire outer surface of a second cylindrical ceramic substrate 6 having an inner diameter larger than an outer diameter of the pickup coil portion 5. As the silver paste, a similar type to the above-described one was used.

Subsequently, the second cylindrical ceramic substrate 6 was subjected to a heat treatment at a temperature of 600° C. for one hour in the atmosphere. With this heat treatment, the volatile components of the silver paste were evaporated, and the silver component was fixedly attached onto the entire outer surface, thus forming a silver layer.

After that, on the silver layer, high-temperature superconducting fine particles were deposited by electrophoresis. The conditions for the high-temperature superconducting fine particles and the electrophoretic deposition technique were the same as above.

Further, the second cylindrical ceramic substrate 6 was subjected to a heat treatment of a thermal hysteresis similar to the one mentioned above, and thus the high-temperature superconducting fine particles were sintered. In this manner, a magnetic shield tube 7 in which a second magnetic shield layer was formed on its outer surface was obtained.

Then, the above-described pickup coil portion 5 was placed such that a distal end portion of the coil portion is inserted within a lower end portion of the magnetic shield tube 7. At the same time, a high-temperature superconducting quantum interference-type element 8 was inserted from an upper end portion of the magnetic shield tube 7. In this manner, the input coil 3 of the pickup coil portion 5 and the high-temperature superconducting quantum interference-type element 8 were magnetically coupled, thus manufacturing a superconducting quantum interference-type magnetic fluxmeter.

It should be noted that the first magnetic shield layer 3 formed on the inner surface of the pickup coil portion 5 has a function of eliminating magnetic noise in the vertical direction.

As described above, a superconducting quantum interference-type magnetic fluxmeter was manufactured in a simple step, at a high efficiency and a low cost.

In the above-described embodiment, the conductive pattern or conductive layer was formed by applying the silver paste on the cylindrical ceramic substrate. The present invention, however, is not limited to this embodiment, but the pattern or layer may be formed by depositing a conductive material by plating or vapor deposition.

Further, the above embodiment presents a case where the high-temperature superconducting fine particles were deposited by the electrophoretic deposition technique. The present invention, however, is not limited to this case, but high-temperature superconducting precursor fine particles, which give rise to high-temperature superconducting fine particles by a heat treatment, may be deposited by the electrophoretic deposition technique. Or, it is alternatively possible that a mixture of high-temperature superconducting fine particles and high-temperature superconducting precursor fine particles is deposited by the electrophoretic deposition technique.

As described above in detail, with the method of manufacturing a superconducting quantum interference type magnetic fluxmeter according to the present invention, it is possible to form a coaxial type pickup coil on an outer surface of a cylindrical ceramic substrate so as to be integrated with an input coil, and therefore a high sensitivity can be achieved for a magnetic gradient in a vertical direction to the high-temperature superconducting quantum interference type element. Further, the scale of the pickup coil can be easily increased, and therefore the sensitivity can be easily improved.

With a superconducting quantum interference type magnetic fluxmeter manufactured by the method of the present invention, it is possible to enhance the efficiency of the non-destructive inspection by magnetism or the somatometry, and therefore the present invention can make a great contribution in the development of the technologies in the superfine magnetic measurements and in the expansion of its usage.

What is claimed is:

1. A method of manufacturing a superconducting quantum interference type magnetic fluxmeter, comprising:
    forming a conductive pattern on an outer surface of a first cylindrical ceramic substrate;
    electrophoretically depositing high-temperature superconducting fine particles and/or high-temperature superconducting precursor fine particles on the conductive pattern; and
    subjecting the first cylindrical ceramic substrate to a heat treatment to sinter the fine particles, thereby forming an input coil and a pickup coil integrated with the input coil.

2. The method according to claim 1, wherein the conductive pattern is formed by forming a conductive paste layer on a surface of the ceramic substrate and subjecting the conductive paste layer to a heat treatment.

3. The method according to claim 1, wherein the conductive pattern is formed by plating a conductive material or vapor deposition of a conductive material.

4. The method according to claim 1, wherein the conductive pattern contains silver as its main component.

5. The method according to claim 1, by further comprising: forming a conductive layer on an inner surface of an upper section of the first cylindrical ceramic substrate, electrophoretically depositing high-temperature superconducting fine particles and/or high-temperature superconducting precursor fine particles on the conductive layer, and subjecting the first cylindrical ceramic substrate to a heat treatment to sinter the fine particles, thereby forming a first magnetic shield layer on the inner surface of the upper section of the first cylindrical ceramic substrate.

6. The method according to claim 5, wherein the conductive layer is formed by forming a conductive paste layer on a surface of the ceramic substrate and subjecting the conductive paste layer to a heat treatment.

7. The method according to claim 5, wherein the conductive layer is formed by plating a conductive material or vapor deposition of a conductive material.

8. The method according to claim 5, wherein the conductive layer contains silver as its main component.

9. The method according to claim 1, by further comprising:
    placing the pickup coil such that a distal end portion thereof is inserted within a lower end portion of a magnetic shield tube having a second high-temperature superconductor shield layer on an outer surface thereof; and
    inserting a high-temperature superconducting quantum interference type element from an upper end portion of the magnetic shield tube, thereby magnetically coupling the input coil and the high-temperature superconducting quantum interference type element, wherein:
    the magnetic shield tube is obtained by forming a conductive layer on an outer surface of a second cylindrical ceramic substrate having an inner diameter larger than an outer diameter of the pickup coil, electrophoretically depositing high-temperature superconducting fine particles and/or high-temperature superconducting precursor fine particles on the conductive layer, and subjecting the second cylindrical ceramic substrate to a heat treatment to sinter the fine particles, thereby forming a second high-temperature superconducting shield layer.

10. The method of manufacturing a superconducting quantum interference type magnetic fluxmeter according to claim 9, wherein the conductive layer is formed by forming a conductive paste layer on a surface of the ceramic substrate and subjecting the conductive paste layer to a heat treatment.

11. The method of manufacturing a superconducting quantum interference type magnetic fluxmeter according to claim 6, wherein the conductive layer is formed by plating a conductive material or vapor deposition of a conductive material.

12. The method of manufacturing a superconducting quantum interference type magnetic fluxmeter according to claim 6, wherein the conductive layer contains silver as its main component.

13. The method according to claim 9, by further comprising: forming a conductive layer on an inner surface of an upper section of the first cylindrical ceramic substrate, electrophoretically depositing high-temperature superconducting fine particles and/or high-temperature superconducting precursor fine particles on the conductive layer, and subjecting the first cylindrical ceramic substrate to a heat treatment to sinter the fine particles, thereby forming a first magnetic shield layer on the inner surface of the upper section of the first cylindrical ceramic substrate.

14. The method according to claim 13, wherein the conductive layer is formed by forming a conductive paste layer on a surface of the ceramic substrate and subjecting the conductive paste layer to a heat treatment.

15. The method according to claim 13, wherein the conductive layer is formed by plating a conductive material or vapor deposition of a conductive material.

16. The method according to claim 13, wherein the conductive layer contains silver as its main component.

* * * * *